(12) United States Patent
Chang et al.

(10) Patent No.: US 10,395,983 B2
(45) Date of Patent: Aug. 27, 2019

(54) METHOD OF FORMING TRENCHES

(71) Applicant: Taiwan Semiconductor Manufacturing Company, Ltd., Hsin-Chu (TW)

(72) Inventors: Che-Cheng Chang, New Taipei (TW); Chih-Han Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/101,778

(22) Filed: Aug. 13, 2018

(65) Prior Publication Data
US 2019/0006233 A1    Jan. 3, 2019

Related U.S. Application Data

(63) Continuation of application No. 15/670,000, filed on Aug. 7, 2017, now Pat. No. 10,049,922, which is a continuation of application No. 14/976,751, filed on Dec. 21, 2015, now Pat. No. 9,728,501.

(51) Int. Cl.
| | |
|---|---|
| *H01L 21/768* | (2006.01) |
| *H01L 21/02* | (2006.01) |
| *H01L 21/033* | (2006.01) |
| *H01L 21/311* | (2006.01) |
| *H01L 23/528* | (2006.01) |
| *H01L 23/532* | (2006.01) |

(52) U.S. Cl.
CPC .... *H01L 21/76831* (2013.01); *H01L 21/0217* (2013.01); *H01L 21/0228* (2013.01); *H01L 21/0332* (2013.01); *H01L 21/31111* (2013.01); *H01L 21/31116* (2013.01); *H01L 21/76802* (2013.01); *H01L 21/76811* (2013.01); *H01L 21/76877* (2013.01); *H01L 23/528* (2013.01); *H01L 23/5329* (2013.01); *H01L 21/31144* (2013.01); *H01L 21/76807* (2013.01)

(58) Field of Classification Search
CPC ......... H01L 21/76807; H01L 21/76811; H01L 21/76813
USPC ....................................... 438/638
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |

(Continued)

FOREIGN PATENT DOCUMENTS

| | | |
|---|---|---|
| CN | 103854990 | 6/2014 |
| CN | 105990126 | 10/2016 |

(Continued)

*Primary Examiner* — George R Fourson, III
(74) *Attorney, Agent, or Firm* — Haynes and Boone, LLP

(57) ABSTRACT

A method of forming a semiconductor device includes forming a material layer over a substrate and forming a first trench in the material layer, forming a conformal capping layer along sidewalls of the first trench, forming a second trench in the material layer while the capping layer is disposed along sidewalls of the first trench and forming a conductive feature within the first trench and the second trench.

20 Claims, 10 Drawing Sheets

(56) References Cited

U.S. PATENT DOCUMENTS

| | | | |
|---|---|---|---|
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2003/0116854 A1* | 6/2003 | Ito | H01L 21/76801 257/761 |
| 2005/0164464 A1 | 7/2005 | Hecht et al. | |
| 2006/0160362 A1* | 7/2006 | Huang | H01L 21/76808 438/700 |
| 2007/0202689 A1* | 8/2007 | Choi | H01L 21/76805 438/637 |
| 2009/0243116 A1* | 10/2009 | Feustel | H01L 21/76807 257/773 |
| 2009/0309226 A1* | 12/2009 | Horak | H01L 21/76805 257/762 |
| 2012/0286353 A1 | 11/2012 | Kuo et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0064884 A1 | 3/2015 | Cheng et al. | |
| 2016/0163711 A1 | 6/2016 | Arndt et al. | |
| 2017/0110398 A1* | 4/2017 | Chang | H01L 21/76805 |
| 2017/0179020 A1 | 6/2017 | Chang et al. | |
| 2017/0194199 A1* | 7/2017 | Chang | H01L 21/7681 |
| 2017/0229341 A1* | 8/2017 | Chang | H01L 21/76831 |
| 2017/0338147 A1 | 11/2017 | Chang et al. | |

FOREIGN PATENT DOCUMENTS

| | | |
|---|---|---|
| JP | S6249422 | 10/1987 |
| JP | 2008251897 | 10/2008 |

\* cited by examiner

METHOD OF FORMING TRENCHES

PRIORITY DATA

The present application is a continuation application of U.S. patent application Ser. No. 15/670,000, filed Aug. 7, 2017, which is a continuation application of U.S. patent application Ser. No. 14/976,751, filed Dec. 21, 2015, each of which is hereby incorporated by reference in its entirety.

BACKGROUND

The semiconductor integrated circuit (IC) industry has experienced rapid growth. Technological advances in IC design and material have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, it is desired to have improvements in the formation of trenches in interconnection structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
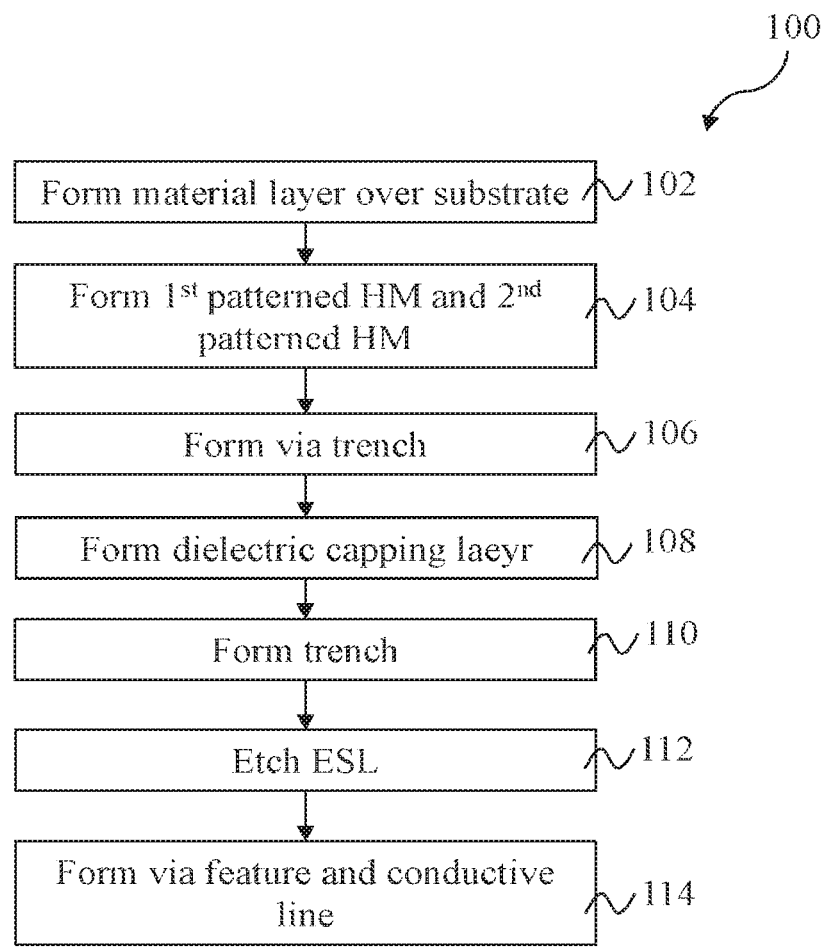
FIG. 1 is a flow chart of a method of fabricating a device or portion provided according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of one embodiment of a method 100 of fabricating one or more semiconductor devices according to aspects of the present disclosure. The method 100 is discussed in detail below, with reference to a semiconductor device precursor 200 shown in FIGS. 2, 3, 4, 5A, 5B, 6, 7A, 7B and 7C for the sake of example. It is understood that additional steps can be provided before, during, and/or after the method, and some of the steps described can be replaced or eliminated for other embodiments of the method.

Figure 2:
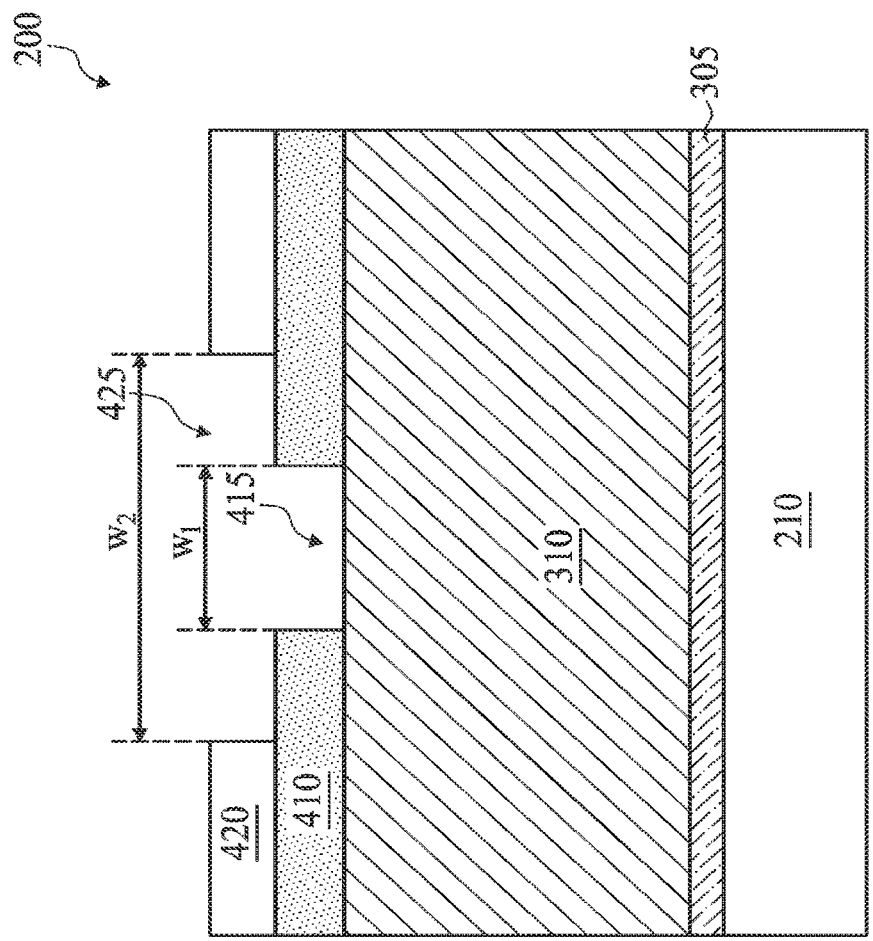
FIGS. 2, 3, 4, 5A, 5B, 6, 7A, 7B and 7C are cross-section views of an embodiment of a device 200 according to aspects of the method of FIG. 1.

Referring to FIGS. 1 and 2, the method 100 begins at step 102 by forming a material layer 310 over a substrate 210. The substrate 210 may include silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various IC devices, such as a complimentary metal-oxide-semiconductor field-effect transistor (CMOSFET), imaging sensor, and/or light emitting diode (LED).

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include one more conductive features (e.g., lines or vias) formed thereon. The conductive features may form a portion of an interconnect structure referred to as a multi-layer interconnect (MLI) typically including a plurality of conductive layers (referred to as metal layers), contacts, and/or vias providing an interconnection of the conductive layers and/or other conductive features. As used herein the term "via" may include a contact feature. Depending on the layer level, the vias may provide connection to the conductive lines (wiring), connection between conductive lines (metal wiring), connection to doped regions, connection to a gate of transistor, connection to a plate of capacitor, and/or connection to other features of a semiconductor device or integrated circuit. The conductive features of the MLI may include barrier or liner layers. In an embodiment, the conductive features include aluminum (Al), copper (Cu), tungsten (W), respective alloys, combinations thereof, and/or other suitable conductive material. The conductive features may also include silicide features, for example, disposed on source, drain, or gate structures of a semiconductor device.

The substrate 210 may also include a plurality of inter-level dielectric (ILD) layers and conductive features integrated to form an interconnect structure and result a functional integrated circuit. In one example, the substrate 210 may include a portion of the interconnect structure and the interconnect structure includes a MLI structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The method 100 may be used to form a portion of the MLI structure discussed above. In other words, the conductive lines and vias (which include contacts) of an MLI may be formed using one or more of the steps of the method 100.

The material layer 310 may include silicon oxide, undoped or doped silicate glasses, such as boron phosphate silicate glass (BPSG), phosphate silicate glass (PSG), undoped or doped thermally grown silicon oxide, undoped or doped TEOS deposited silicon oxide, organo-silicate glass, porous low-k materials, and/or other suitable dielectric materials. In some embodiments, the material layer 310 includes extra-low k (ELK) dielectric. Suitable extra-low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SiLK (Dow Chemical, Midland, Mich.), polyimide, porous polymer and/or other suitable materials as examples.

In some embodiments, prior to forming the material layer 310, an etch stop layer (ESL) 305 is formed over the substrate 210 and the material layer 310 is then formed over the ESL 305. The ESL 305 has an etch selectivity to the material layer 310 and functions to stop etch during subsequent operation to pattern the material layer 310. The ESL 305 may include silicon nitride, silicon oxynitride, silicon carbide, titanium oxide, titanium nitride, tantalum oxide, tantalum nitride, combinations thereof, and/or other suitable materials. In various examples, the ESL 305 and the material layer 310 may be deposited by chemical vapor deposition (CVD), physical vapor deposition (PVD), atomic layer deposition (ALD), thermal oxidation, spin-on coating, combinations thereof, or other suitable techniques.

Referring again to FIGS. 1 and 2, method 100 proceeds to step 104 by forming a first patterned hard mask (HM) 410 over the material layer 310 and a second patterned HM 420 over the first patterned HM 410. The first patterned HM 410 has a first opening 415 with a first width $w_1$ and the second HM 420 has a second opening 515 with a second width $w_2$. In the present embodiment, the second width $w_2$ is greater than the first width $w_1$. In an embodiment, the second width $w_2$ is greater than two times the width of first width $w_1$. In some embodiments, the first opening 415 defines a via feature and the second opening 425 defines a metal line connecting with the via feature. The second opening 425 connects and aligns to the first opening 415.

The first and second patterned HMs, 410 and 420, may include silicon oxide, silicon nitride, silicon oxynitride, silicon carbide, titanium oxide, titanium nitride, tantalum oxide, tantalum nitride, combinations thereof, and/or other suitable materials. In the present embodiment, the first patterned HM 410 may include a material which is different from the material layer 310 to achieve etching selectivity during subsequent etch processes. The second patterned HM 420 may include a material which is different from the material layer 310 and the first patterned HM 410 to achieve etching selectivity during subsequent etch processes. In an embodiment, the material layer 310 includes extra-low k dielectric, the first patterned HM 410 includes silicon nitride and the second patterned HM 420 includes titanium nitride.

The first and second patterned HMs, 410 and 420, may be formed by processes of deposition, lithography and etch. The deposition process may include CVD, ALD, PVD, thermal oxidation, spin-on coating combinations thereof, and/or other suitable techniques. An exemplary lithography process may include forming a photoresist layer, exposing the photoresist layer by a lithography exposure process, performing a post-exposure bake process, and developing the photoresist layer to form the patterned resist layer. The etching process may include a wet etch, a dry etch, and/or a combination thereof.

Figure 3:
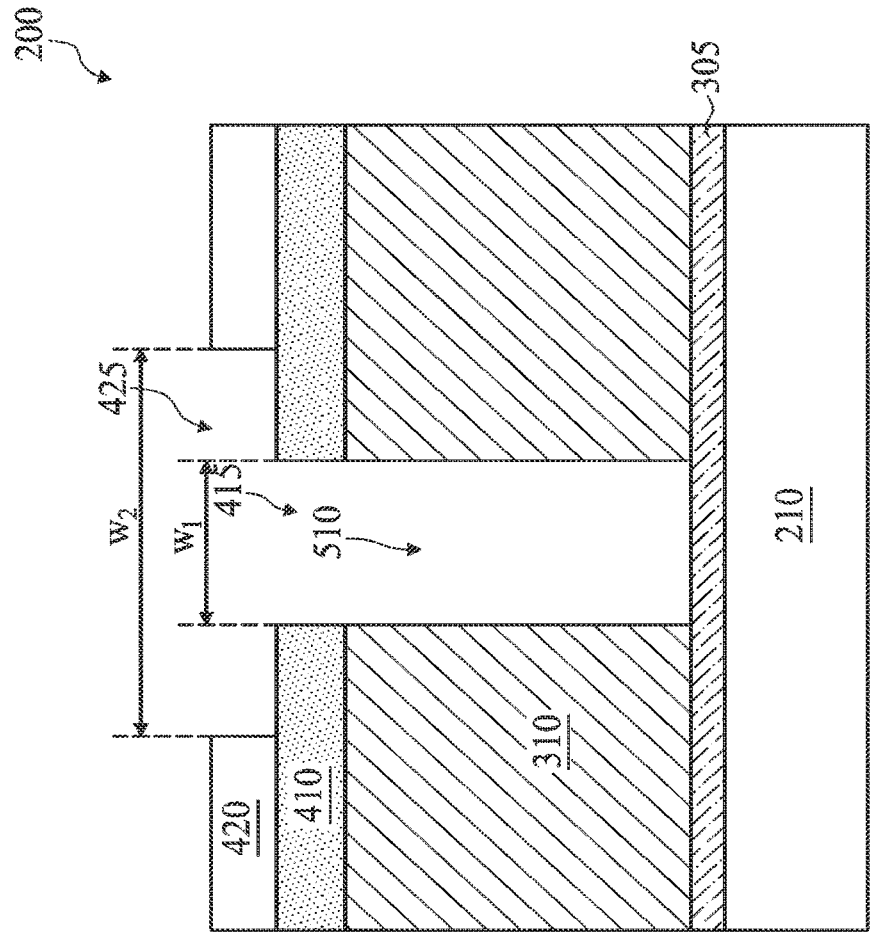

Referring to FIGS. 1 and 3, method 100 proceeds to step 106 by etching the material layer 310 through the first opening 415 to form a via trench 510. In some embodiments, the via trench 510 extends through the material layer 310 down to the ESL 305. The etch process may include a wet etch, a dry etch, and/or a combination thereof. For example, a dry etching process may use chlorine-containing gases, fluorine-containing gases, other etching gases, and/or a combination thereof. The wet etching solutions may include $NH_4OH$ (ammonium hydroxide), HF (hydrofluoric acid) or diluted HF, deionized water, TMAH (tetramethylammonium hydroxide), other suitable wet etching solutions, or combinations thereof. The via etch process may be tuned with various etching parameters, such as etchant used, etching temperature, etching solution concentration, etching pressure, etchant flow rate, and/or other suitable parameters. In some embodiments, the etch process is chosen to selectively etch the material layer 310 without substantially etching the first and second patterned HMs, 410 and 420. As has been mentioned previously, the ESL 305 serves as an etch stop layer, which improves etch process window and profile control. In some embodiments, the etch process includes an anisotropic dry etch and thus the via trench 510 is formed with a vertical profile and has a same width as the first opening 415, namely the first width $w_1$. As an example, via etch process may include a plasma dry etching process using a fluorine-based chemistry, such as $CF_4$, $SF_6$, $CH_2F_2$, $CHF_3$, and/or $C_2F_6$.

Figure 4:
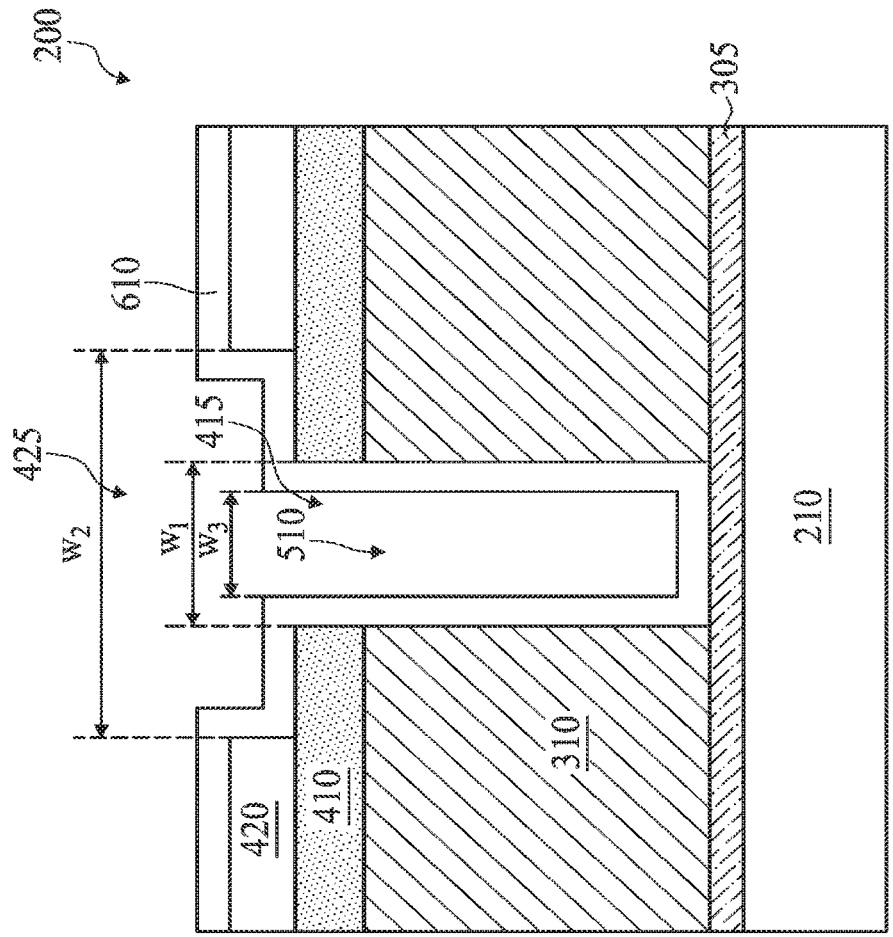

Referring to FIGS. 1 and 4, method 100 proceeds to step 108 by forming a conformal dielectric capping layer 610 along sidewalls of the via trench 510. Typically, after forming a trench (e.g. via trench 510) through an extra-low k dielectric material (e.g. material layer 310) additionally etching processes are performed on the extra-low k dielectric material which degrades/changes the trench profile. This changing trench profile leads to adverse impacts on device performance, such as increasing pitch size design rule, increasing lithography overlay constrains, increasing etching process variation, poor metal gap filling widow and high via resistance.

To prevent at least a portion of the profile of via trench 510 from changing during subsequent processing, the present disclosure forms a protection layer (or capping layer) along the sidewalls and bottom of the via trench 510. Specifically, as shown in FIG. 4, dielectric capping layer 610 is formed along sidewalls and the base of the via trench 510 to assist in protecting/maintaining at least a portion of the profile of via trench 510 (e.g. width $w_3$) during subsequent etch processes. The dielectric capping layer 610 includes a material that it is different from the material layer 310 to achieve etching selectivity during subsequent etch processes and has lower polymer formation tendency than the material layer 310 during subsequent etch processes. In some embodiments, the dielectric capping layer 610 may include non-carbon-containing materials for polymer buildup reduction. In an embodiment, a silicon nitride capping layer 610 is formed along sidewalls of the via trench 510 in the extra-low k dielectric layer 310. Alternatively, a silicon oxynitride capping layer 610 is formed along sidewalls and bottom of the via trench 510 formed in the ELK layer 310. The dielectric capping layer 610 may be formed by CVD, PVD, ALD, and/or other suitable techniques. In an embodiment, the dielectric capping layer 610 is formed by ALD process to achieve a conformal sidewall coverage along sidewalls of the via trench 510. The dielectric capping layer 610 is also deposited over portions of the first and second patterned HMs, 410 and 420, which will be removed during subsequent etch processes.

In the present embodiment, with the dielectric capping layer 610 disposed along sidewalls, the width of the via trench 510 is reduced from the first width $w_1$ to a third width $w_3$. Thus, instead of using a lithography process and etching process, a dimension of the via trench 510 may be further reduced by forming the dielectric capping layer 610 along sidewalls of the via trench 510. As discussed below, dielectric capping layer 610 allows the remaining portion of via trench 510 to maintain width $w_3$ during subsequent etchings.

Figure 5A:
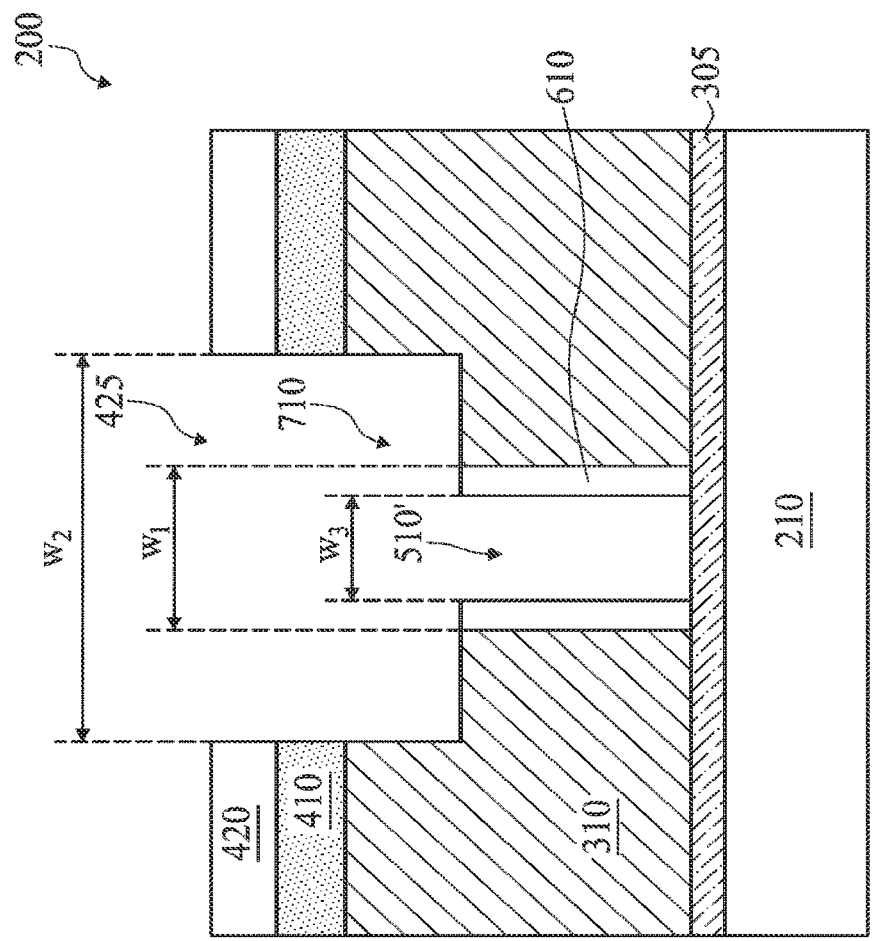

Referring to FIGS. 1 and 5A, method 100 proceeds to step 110 by etching the first patterned HM 410 and the material layer 310 through the second opening 425 to form a trench 710. The upper portion of the via trench 510 is etched away while a lower portion of the via trench 510' (or remaining via trench 510') remains covered by dielectric capping layer 610. In some embodiments, etch depth is controlled such that the trench 710 is formed in an upper portion of the material layer 310 and aligns and connects with the remaining via trench 510'. The trench etch process may include a wet etch, a dry etch, and/or a combination thereof. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof. The trench etch process may be tuned with various etching parameters, such as etchant used, etching temperature, etching solution concentration, etching pressure, etchant flow rate, and/or other suitable parameters. In some embodiment, the trench etch process may include a selective anisotropic dry etch that etches the exposed first HM 410 and the material layer 310 through the second opening 425, without substantially etching the dielectric capping layer 610 along sidewalls of the remaining via trench 510'. In an embodiment, the dry etch process uses a fluorine-based chemistry, such as $CF_4$, $SF_6$, $CH_2F_2$, $CHF_3$, and/or $C_2F_6$.

As has been mentioned above, dielectric capping layer 610 protects/maintains the profile of remaining via trench 510' (e.g. width $w_3$) during the etching process occurring at step 110. In that regard, the dielectric capping layer 610 protects the material layer 310 forming/defining remaining via trench 510' from exposure to the etching solution/gases. This in turn, avoids/prevents the material layer 310 forming/defining remaining via trench 510' from reacting with etching solutions/gases that otherwise would form a polymer buildup on the material 310 and thereby degrade/change the profile of the remaining via trench 510'. That is, with its low polymer formation tendency (e.g. non-carbon-containing material) the dielectric capping layer 610 reduces or prevents polymer buildup along sidewalls of the remaining via trench 510'. As a result, sidewall profile and width of the remaining via trench 510' is preserved, namely width $w_3$ is preserved. In a particular embodiment, the silicon nitride capping layer 610 preserves sidewall profile and width $w_3$ of the remaining via trench 510' formed in the extra low-k dielectric layer 310 and prevents polymer buildup along sidewalls of the remaining via trench 510' during a dry etch process using a fluorine-based chemistry, such as $CF_4$, $SF_6$, $CH_2F_2$, $CHF_3$, and/or $C_2F_6$.

Figure 5B:
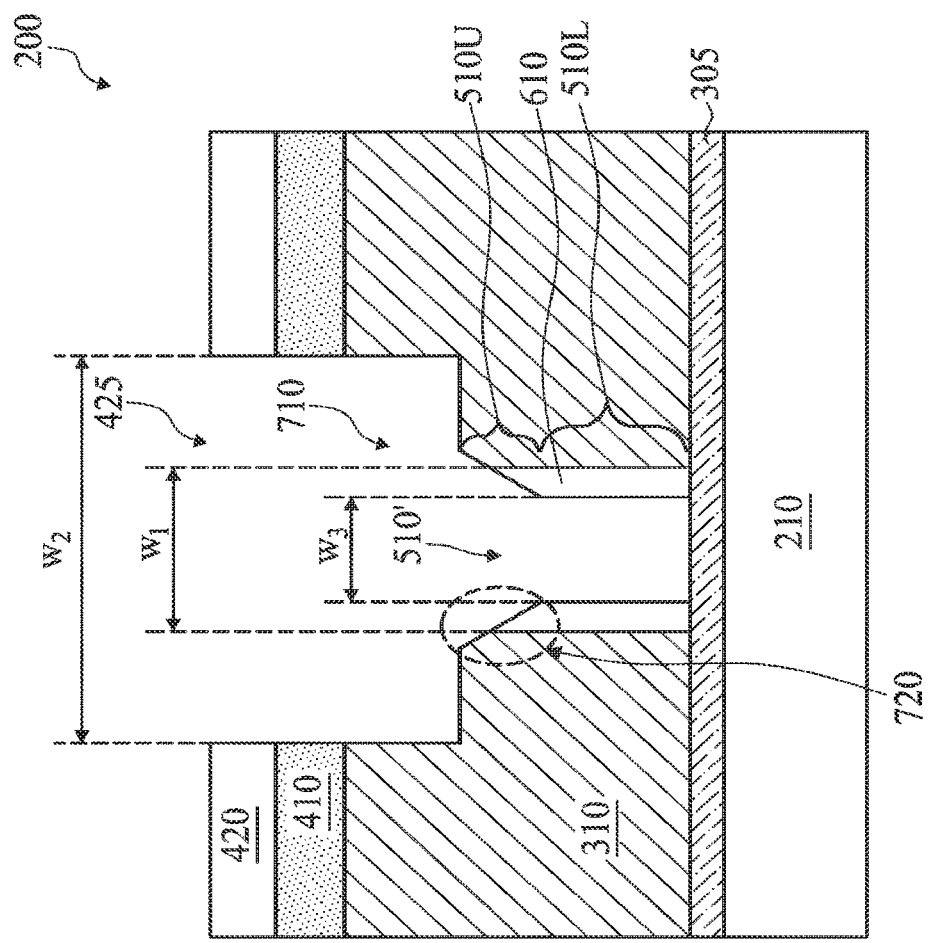

In an alternative embodiment, referring to FIG. 5B, sometimes, corners 720 (where the trench 710 connects with the remaining via trench 510') experiences a higher etch rate (e.g. due to a larger surface for ionic bombardment) and results in rounding corners and/or an un-even loss of the dielectric capping layer 610 near the corners 720. As a result, an upper portion 510U of the remaining via trench 510' has a tapper profile while a lower portion 510L of the remaining via trench 510' has a vertical profile. A thickness of the dielectric capping layer 610 becomes thinner and thinner along the sidewalls of the upper portion 510U towards up to the trench 710. In an embodiment, the dielectric capping layer 610 does not fully cover the sidewalls of the upper portion 510U and the material layer 310 is exposed in the corners 720.

Figure 6:
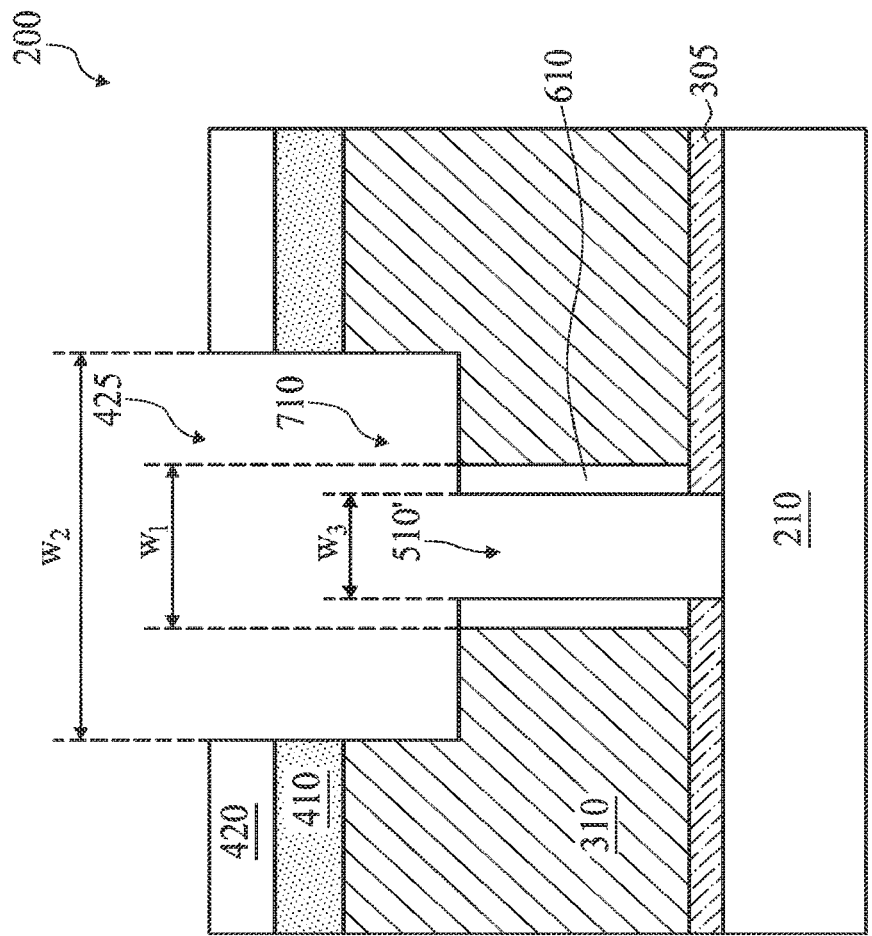

Referring to FIGS. 1 and 6, method 100 proceeds to step 112 by etching the ESL 305 to extend the remaining via trench 510' through the ESL 305 and expose the substrate 210 within the remaining via trench 510'. The ESL 305 may be etched by a wet etch, a dry etch, and/or a combination thereof. In the present embodiment, similarly, sidewalls of the remaining via trench 510' are covered by the dielectric capping layer 610 during etching the ESL 305 to again prevent polymer buildup along sidewalls of the remaining via trench 510' and thereby preserve the via trench's profile and via trench width, namely the third width $w_3$. In some embodiments, the ESL 305 is etched by a selective etch which etches the ESL 305 without substantially etch the material layer 310 and the dielectric capping layer 610.

Figure 7A:
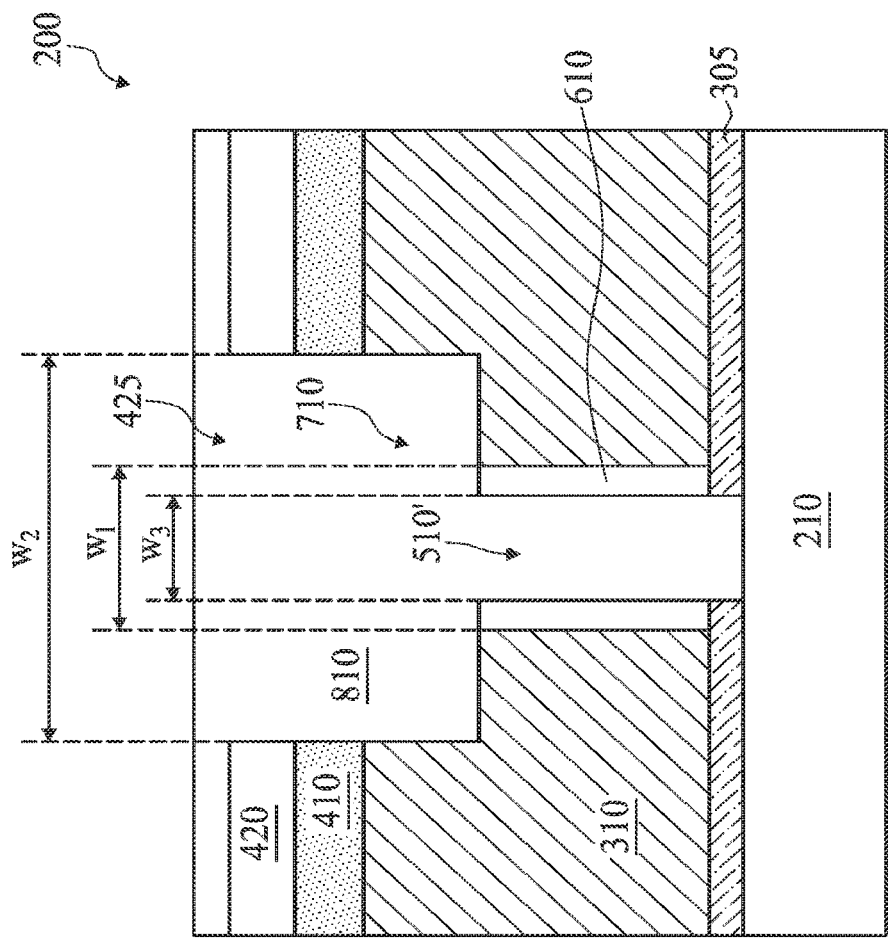

Referring to FIGS. 1 and 7A, method 100 proceeds to step 114 by filling in the trench 710 and the remaining via trench 510' with a conductive material 810. The conductive material 810 may include seed layers, liner layers, and/or other multi-layer structures. In some embodiments, prior to forming the conductive material 810, a barrier layer (not shown) is formed first. The barrier layer may include a metal and is electrically conductive but does not permit inter-diffusion and reactions between the material layer 310 (including the dielectric capping layer 610) and conductive material 810 to be filled in the remaining via trench 510' and the trench 710. The barrier layer may include refractory metals and their nitrides. In various examples, the first barrier layer includes TiN, TaN, Co, WN, TiSiN, TaSiN, or combinations thereof. The first barrier layer may include multiple films.

The conductive material 810 then fills in the remaining via trench 510' and the trench 710, over the barrier layer. The conductive material 810 may include metallic nitrides, elemental metals, and/or combinations thereof. Example compositions include copper (Cu), tungsten (W), titanium (Ti), aluminum (Al), hafnium (Hf), molybdenum (Mo), scandium (Sc), yttrium (Y), nickel (Ni), platinum (Pt), and/or other suitable metals. Example metal nitride compositions include titanium nitride (TiN), tantalum nitride (TaN), tungsten nitride (WN), and/or other suitable metal nitrides. The barrier layer and the conductive material 810 may be formed using one or more deposition steps, such as, ALD, PVD, CVD, plating (ECP), and/or other suitable processes. In an embodiment, the remaining via trench 510' and the trench 710 are filled contemporaneously with the same conductive material 810.

In some embodiments, after the deposition of the conductive material 810, a planarization process, such as performed by a chemical mechanical polishing (CMP) process to be performed to planarize the top surface of the conductive material 810. In some embodiments, the CMP process used to planarize the top surface of the conductive material 810 may also serve to remove the first and second HMs, 410 and 420. The conductive material 810 remains within the remaining via trench 510' and the trench 710 forms a via feature 820 and a conductive line 830, respectively, as shown in FIG. 7B.

Figure 7B:
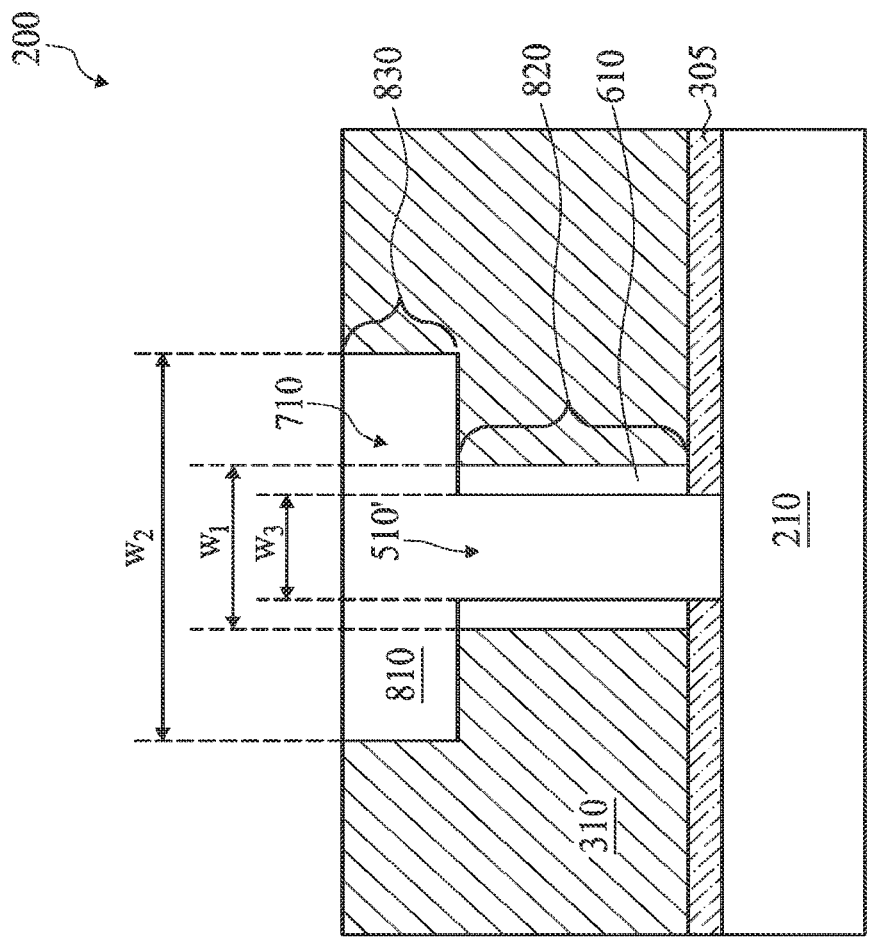

Referring to FIG. 7B, the via feature 820 carries vertical profile of the remaining via trench 510' and has the dielectric capping layer 610 along its sidewalls. In another word, the via feature 820 is separated from the material layer 310 by the dielectric capping layer 610. A portion of the bottom of the conductive line 830 physically contacts to the via feature 820, including the dielectric capping layer 610 along sidewalls of the via feature 820. The conductive line 830 has the second width $w_2$. The via feature 820 may be referred to as Vx, while the conductive line 830 may be referred to as Mx+1, where x is the layer of the back-end metallization process.

Figure 7C:
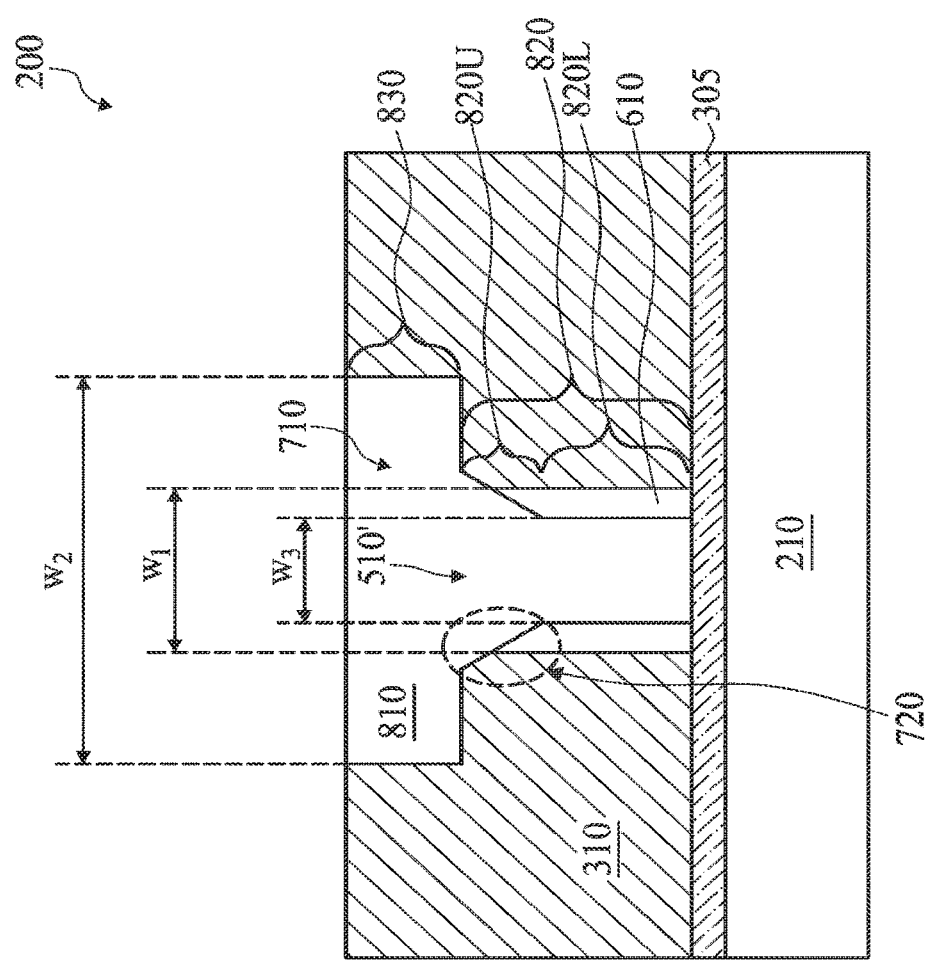

As shown in FIG. 7C, for circumstances where the dielectric capping layer 610 has a tapper profile along sidewalls of the upper portion 510U (as shown in FIG. 5B), the via feature 820 formed by the conductive material 810 within the remaining via trench 510' and the conductive line 830 formed by the conductive material 810 within the trench 710. A lower portion 820L of the via feature 820 separates from the material layer 310 by the dielectric capping layer 610 and has the third width $w_3$. An upper portion 820U of the via feature 820 physically contacts to the material layer 310. A portion of the bottom of the conductive line 830 physically contacts to the via feature 820. The conductive line 830 has the second width $w_2$.

Additional process steps may be implemented before, during, and after method 100, and some process steps described above may be replaced or eliminated in accordance with various embodiments of method 100.

Based on the above, it can be seen that the present disclosure provides methods of forming a second trench over an existing first trench. The method employs forming a capping layer along sidewalls of the existing first trench to protect it during forming the second trench. With quite simple and feasible process integration, the method preserves sidewall profile and width of the existing first trench.

The present disclosure provides many different embodiments of a method for forming a semiconductor device. The method includes forming a material layer over a substrate and forming a first trench in the material layer. The first trench has a first width. The method also includes forming a conformal capping layer along sidewalls of the first trench. The capping layer has a different etch rate than the material layer. The method also includes forming a second trench in the material layer while the capping layer is disposed along sidewalls of the first trench. The second trench has a second width which is greater than the first width. The second trench is in communication with the first trench. The method also includes forming a conductive feature within the first trench and the second trench.

In another embodiment, a method includes forming a dielectric layer over a substrate, forming a first patterned hard mask over the dielectric layer and the first patterned hard mask has a first opening having a first width. The method also includes forming a second patterned hard mask over the first patterned hard mask and the second patterned hard mask has a second opening having a second width which is greater than the first width. The second opening aligns to the first opening. The method also includes etching the dielectric layer through the first opening to form a forming a via trench in the dielectric layer and forming a conformal dielectric capping layer along sidewalls of the via trench. The dielectric capping layer has a different etch rate than the dielectric layer. The method also includes etching the dielectric layer through the second opening to form a trench while the dielectric capping layer disposed along sidewalls of the via trench and forming a conductive feature within the via trench and the trench.

In yet another embodiment, a device includes a dielectric layer over a substrate, a conductive feature disposed in the dielectric layer and physically contacting the substrate. The conductive feature includes a first portion having a first width and a second portion having a second width, which is greater than the first width. The device also includes a dielectric capping layer disposed along a lower portion of sidewalls of the first portion of the conductive feature. The lower portion of the first portion of the conductive feature is separated from the dielectric layer by the dielectric capping layer. An upper portion of the first portion of the conductive feature physically contacts the dielectric layer. The dielectric capping layer has a different material than the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first material layer over a substrate;
   forming a first trench in the first material layer;
   forming a second material layer along sidewalls of the first trench;
   forming a second trench in the first material layer while the second material layer is disposed along the sidewalls of the first trench, wherein the second material layer has a tapered top surface after the forming of the second trench;
   after the forming of the second trench, extending the first trench to expose a portion of the substrate within the first trench; and
   forming a conductive feature within the first trench and the second trench such that the conductive feature covers the second material layer having the tapered top surface.

2. The method of claim 1, wherein the second trench is in communication with the first trench.

3. The method of claim 1, further comprising forming an etch stop layer over the substrate, and
   wherein a portion of the etch stop layer is exposed within the first trench after the forming of the first trench in the first material layer.

4. The method of claim 3, wherein the forming of the second material layer along sidewalls of the first trench includes forming a portion of the second material layer directly on the portion of the etch stop layer.

5. The method of claim 3, wherein the forming of the second trench in the first material layer includes removing the portion of the second material layer such that the portion of the etch stop layer is exposed.

6. The method of claim 1, wherein the substrate includes a semiconductor material,
   wherein the first material layer includes a first dielectric material, and
   wherein the second material layer includes a second dielectric material that is different than the first dielectric material.

7. The method of claim 6, wherein the first dielectric material includes an extra-low k dielectric material, and
   wherein the second dielectric material includes a material selected from the group consisting of silicon nitride and silicon oxynitride.

8. A method comprising:
   forming a dielectric layer over a substrate;
   forming a first hard mask layer over the dielectric layer;
   removing a first portion of the dielectric layer to form a first trench within the dielectric layer and through the first hard mask layer;
   forming a material layer in the first trench along sidewalls of the dielectric layer and the first hard mask layer;
   removing a second portion of the dielectric layer and a portion of the first hard mask layer to form a second trench within the dielectric layer, wherein a remaining portion of the material layer is disposed within the first trench along a sidewall of the dielectric layer after the removing of the second portion of the dielectric layer and the portion of the first hard mask layer to form the second trench; and
   forming a conductive feature within the first trench and the second trench, wherein the forming of the conductive feature within the first trench and the second trench includes forming the conductive feature directly on the remaining portion of the material layer disposed within the first trench.

9. The method of claim 8, wherein a remaining portion of the first hard mask layer is disposed over the dielectric layer after the removing of the second portion of the dielectric layer and the portion of the first hard mask layer to form the second trench within the dielectric layer.

10. The method of claim 9, wherein the forming of the conductive feature within the first trench and the second trench includes forming the conductive feature over the remaining portion of the first hard mask layer.

11. The method of claim 9, further comprising removing the remaining portion of the first hard mask layer after the forming of the conductive feature within the first trench and the second trench.

12. The method of claim 8, further comprising forming a second hard mask layer over the first hard mask layer, the second hard mask layer formed of a different material than the first hard mask layer.

13. The method of claim 12, wherein the forming of the second hard mask layer over the first hard mask layer includes forming an opening through the second hard mask layer that exposes the portion of the first hard mask layer.

14. The method of claim 13, wherein the forming of the material layer in the first trench along sidewalls of the dielectric layer and the first hard mask layer includes forming the material layer directly on the portion of the first hard mask layer and the second hard mask layer.

15. A method comprising:
   forming an etch stop layer over the substrate;
   forming a first dielectric layer over a substrate;
   removing a first portion of the first dielectric layer to form a first trench in the first dielectric layer, wherein a sidewall of the first trench is defined by the first dielectric layer;
   forming a capping layer directly on the sidewall of the first dielectric layer, wherein the forming of the capping layer directly on the sidewall of the first dielectric layer includes forming a portion of the capping layer directly on a portion of the etch stop layer;
   removing a second portion of the first dielectric layer to form a second trench, wherein the capping layer remains disposed on the sidewall of the first dielectric layer after the removing of the second portion of the first dielectric layer to form the second trench, wherein the removing of the second portion of the first dielectric layer to form the second trench includes removing the portion of the capping layer to expose the portion of the etch stop layer; and
   forming a conductive feature within the first and second trenches such that the conductive feature covers the capping layer.

16. The method of claim 15, wherein the capping layer is formed of a dielectric material.

17. The method of claim 15, wherein the first trench is in communication with the second trench.

18. The method of claim 15, further comprising removing the portion of the etch stop layer prior to the forming of the conductive feature within the first and second trenches.

19. The method of claim 15, wherein the capping layer includes silicon.

20. The method of claim 8, wherein the remaining portion of the material layer has a tapered top surface after removing the second portion of the dielectric layer and the portion of the first hard mask layer to form the second trench, and wherein the forming of the conductive feature directly on the remaining portion of the material layer disposed within the first trench includes forming the conductive feature directly on the tapered top surface of the remaining portion of the material layer.

* * * * *